(12) United States Patent
Kuo et al.

(10) Patent No.: US 9,093,471 B2
(45) Date of Patent: Jul. 28, 2015

(54) METHOD FOR FORMING TRENCH MOS STRUCTURE

(71) Applicant: NANYA TECHNOLOGY CORP., Tao-Yuan Hsien (TW)

(72) Inventors: Chin-Te Kuo, New Taipei (TW); Yi-Nan Chen, Taipei (TW); Hsien-Wen Liu, Taoyuan County (TW)

(73) Assignee: NANYA TECHNOLOGY CORP., Gueishan Dist., Taoyuan (TW)

( * ) Notice: Subject to any disclaimer, the term of this patent is extended or adjusted under 35 U.S.C. 154(b) by 0 days.

(21) Appl. No.: 14/534,192

(22) Filed: Nov. 6, 2014

(65) Prior Publication Data

US 2015/0064893 A1 Mar. 5, 2015

Related U.S. Application Data

(62) Division of application No. 13/106,852, filed on May 12, 2011, now Pat. No. 8,912,595.

(51) Int. Cl.
*H01L 29/66* (2006.01)
*H01L 29/423* (2006.01)
*H01L 29/78* (2006.01)
*H01L 21/308* (2006.01)

(52) U.S. Cl.
CPC ...... *H01L 29/66666* (2013.01); *H01L 29/4236* (2013.01); *H01L 29/66734* (2013.01); *H01L 29/7813* (2013.01); *H01L 29/7827* (2013.01); *H01L 21/3083* (2013.01)

(58) Field of Classification Search
CPC ............ H01L 29/7802; H01L 29/7827; H01L 29/4236; H01L 29/66734; H01L 29/7813; H01L 29/66666

USPC .................................................. 438/270, 589
See application file for complete search history.

(56) References Cited

U.S. PATENT DOCUMENTS

| | | | |
|---|---|---|---|
| 5,623,152 A | 4/1997 | Majumdar | |
| 6,075,269 A | 6/2000 | Terasawa | |
| 6,509,608 B1 | 1/2003 | Hueting | |
| 6,521,538 B2 * | 2/2003 | Soga et al. | 438/695 |
| 6,686,625 B2 | 2/2004 | Tihanyi | |
| 7,612,408 B2 | 11/2009 | Zundel | |
| 8,575,689 B2 * | 11/2013 | Mimura et al. | 257/330 |

(Continued)

FOREIGN PATENT DOCUMENTS

| | | |
|---|---|---|
| CN | 1542984 A | 11/2004 |
| CN | 1941411 A | 4/2007 |
| CN | 101826551 A | 9/2010 |

*Primary Examiner* — Mohammad Islam
*Assistant Examiner* — John P Dulka
(74) *Attorney, Agent, or Firm* — Winston Hsu; Scott Margo

(57) ABSTRACT

A method for forming a trench MOS structure. First, a substrate, an epitaxial layer, a doping region and a doping well are provided. The substrate has a first conductivity type, a first side and a second side opposite to the first side. The epitaxial layer has the first conductivity type and is disposed on the first side. The doping well has a second conductivity type and is disposed on the epitaxial layer. The doping region has the first conductivity type and is disposed on the doping well. A gate trench penetrates the doping region and the doping well. The doping well is partially removed to form a bottom section of the gate trench. A gate isolation is formed to cover the inner wall of the bottom section and a top section of the gate trench. The gate trench is filled with a conductive material to form a trench gate.

10 Claims, 5 Drawing Sheets

(56) References Cited

U.S. PATENT DOCUMENTS

| | | |
|---|---|---|
| 8,680,607 B2 | 3/2014 | Zeng |
| 2001/0023961 A1 | 9/2001 | Hshieh |
| 2005/0145883 A1 | 7/2005 | Beach |
| 2005/0157571 A1 | 7/2005 | Schaffer |
| 2006/0091453 A1* | 5/2006 | Matsuda et al. ............. 257/330 |
| 2006/0263991 A1* | 11/2006 | Lee et al. .................. 438/296 |
| 2006/0267085 A1* | 11/2006 | Matsuura ................... 257/330 |
| 2008/0150018 A1 | 6/2008 | Tanabe |
| 2008/0164520 A1 | 7/2008 | Darwish |
| 2008/0296673 A1 | 12/2008 | Tai |
| 2010/0065906 A1 | 3/2010 | Alter |
| 2010/0308400 A1 | 12/2010 | Darwish |

* cited by examiner

METHOD FOR FORMING TRENCH MOS STRUCTURE

CROSS REFERENCE TO RELATED APPLICATIONS

This application is a division of U.S. application Ser. No. 13/106,852 filed May 12, 2011, now U.S Pat. No. 8,912,595, which is included in its entirety herein by reference.

BACKGROUND OF THE INVENTION

1. Field of the Invention

The present invention generally relates to a trench MOS structure and a method for forming a MOS trench structure. In particular, the present invention generally relates to a trench MOS structure with a much stronger surrounding electric field.

2. Description of the Prior Art

A trench gate MOS is one of the MOS structures used in semiconductor devices. For increasing the electrical field around the device, the trench gate is usually designed as a circular type.

At a given voltage, a trench gate MOS usually has better performance at a higher current. Accordingly, it is still needed to provide a trench MOS structure with less electrical resistance between the source and the drain.

SUMMARY OF THE INVENTION

The present invention in a first aspect proposes a trench MOS structure with an increase electrical field around the trench MOS structure. The trench MOS structure of the present invention includes a substrate, an epitaxial layer, a doping well, a doping region and a trench gate. The substrate has a first conductivity type, a first side and a second side opposite to the first side. The epitaxial layer has the first conductivity type and is disposed on the first side. The doping well has a second conductivity type and is disposed on the epitaxial layer. The doping region has the first conductivity type and is disposed on the doping well. The trench gate is at least partially disposed in the doping region. The trench gate has a bottle shaped profile with a top section smaller than a bottom section, both are partially disposed in the doping well. The bottom section of two adjacent trench gates results in a higher electrical field around the trench MOS structures.

In one embodiment of the present invention, the top section and the bottom section together form the bottle shaped profile.

In another embodiment of the present invention, the top section is the bottle neck of the bottle shaped profile.

In another embodiment of the present invention, the trench MOS structure of the present invention further includes a plug of a plug width and a plurality of the trench gates. The plug is in direct contact with the doping region and a plurality of the trench gates are adjacent to one another.

In another embodiment of the present invention, there is a plug pitch between the plug and the trench gate. The distance between any of two adjacent bottom sections is not smaller than the sum of the plug pitch and the plug width.

The present invention in a second aspect proposes a method for forming a trench MOS structure. First, a substrate, an epitaxial layer, a doping well and a doping region are provided. The substrate has a first conductivity type, a first side and a second side opposite to the first side. The epitaxial layer has the first conductivity type and is disposed on the first side. The doping well has a second conductivity type and is disposed on the epitaxial layer. The doping region has the first conductivity type and is disposed on the doping well. Second, a vertical etching step is carried out to form a gate trench which penetrates the doping region and the doping well. Next, a lateral etching step is carried out to partially remove the doping well for forming a bottom section of the gate trench. Then an oxidizing step is carried out to form a gate isolation to cover the inner wall of the bottom section and a top section of the gate trench. Afterwards, the gate trench is filled with a conductive material to form a trench gate.

In one embodiment of the present invention, the lateral etching step is a wet etching step.

In another embodiment of the present invention, the lateral etching step may include the following steps. First, a mask is disposed in the gate trench and to cover the doping well. Then, a doping region oxidizing step is carried out to form a sacrificial layer which covers the inner wall of the doping region and exposes the mask in the gate trench. Later, the mask is removed to expose the doping well. Next, the lateral etching step is carried out.

In another embodiment of the present invention, the mask includes a photoresist.

In another embodiment of the present invention, the steps further include to remove the sacrificial layer.

In another embodiment of the present invention, the vertical etching step forms a top section which forms a bottle shaped profile together with the bottom section.

In another embodiment of the present invention, the top section is the bottle neck of the bottle shape.

In another embodiment of the present invention, the following steps may be carried out. First, a plurality of the trench gates are formed adjacent to one another. Then, a plug of a plug width is formed in direct contact with the doping region.

In another embodiment of the present invention, there is a plug pitch between the plug and the trench gate. The distance between any two adjacent bottom sections is not smaller than the sum of the plug pitch and the plug width.

These and other objectives of the present invention will become obvious to those of ordinary skill in the art after reading the following detailed description of the preferred embodiment that is illustrated in the various figures and drawings.

DETAILED DESCRIPTION

The term "horizontal" as used herein is defined as a plane parallel to the conventional major plane or surface of the semiconductor chip or die substrate, regardless of its orientation. The term "vertical" refers to a direction perpendicular to the horizontal as just defined. The term "lateral" refers to a direction parallel to the horizontal as just defined. Terms, such as "on", "bottom", "top", "side" (as in "sidewall") are defined with respect to the horizontal plane.

Figure 1:
FIGS. 1-9 illustrate the method for forming a trench MOS structure of the present invention.

The present invention in a first aspect provides a method for forming a trench MOS structure. Please refer to FIGS. 1-9, which illustrate the method for forming a trench MOS structure of the present invention. First, as shown in FIG. 1, a substrate 101, an epitaxial layer 110, a doping well 120 and a doping region 130 are provided. The substrate 101 is usually a semiconductive material, such as Si, and the substrate 101 has a first conductivity type, such as a P type or an N type, for example N type. The substrate 101 further has a first side 105 and a second side 106 opposite to and parallel with the first side 105. The epitaxial layer 110, the doping well 120 and the doping region 130 are usually disposed in an active region (not shown) on the substrate 101.

The epitaxial layer 110, the doping well 120 and the doping region 130 all are disposed on the first side 105 of the substrate 101. The epitaxial layer 110 may have the first conductivity type, for example, N+ type, and is disposed on and in direct contact with the first side 105. The doping well 120 with a second conductivity type is disposed on and in direct contact with the epitaxial layer 110. The doping region 130 of the first conductivity type is disposed on the doping well 120. The second conductivity type may be a P type or an N type, for example, P type.

Figure 2:
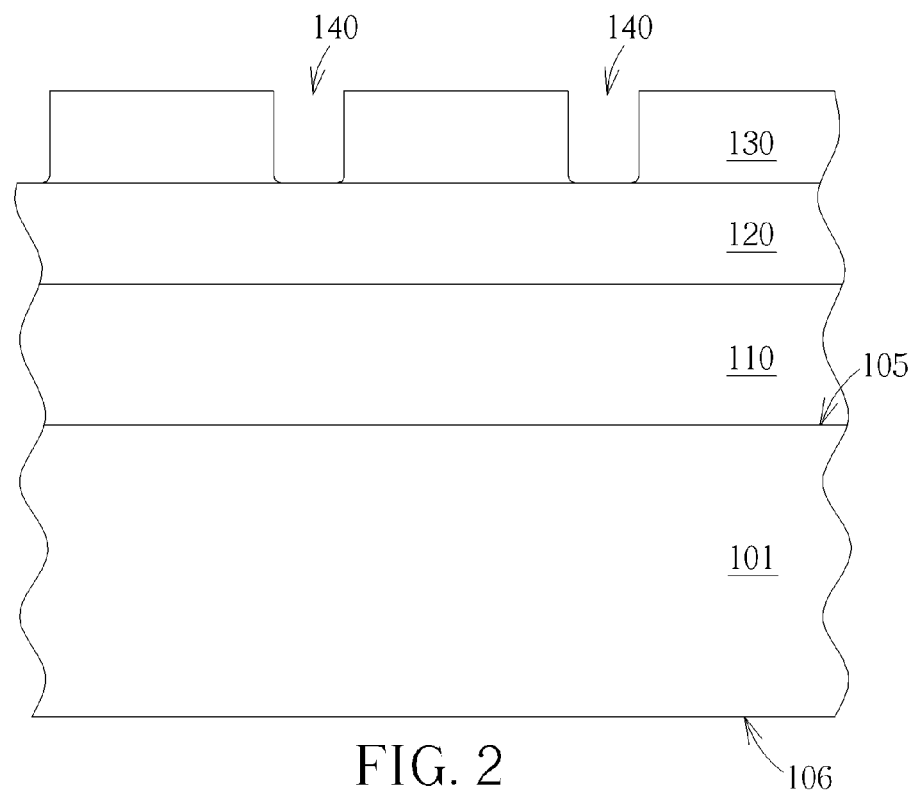

Second, as shown in FIG. 2, a first etching step, such as Si isotropic etch, is carried out to form at least one preliminary via 140 in the doping region 130. The first etching step is usually a vertical etching step to remove some of the doping region 130. The first etching step is usually a dry etching step and may be carried out in the presence of a patterned etching mask (not shown) to define the preliminary via 140.

Figure 3:
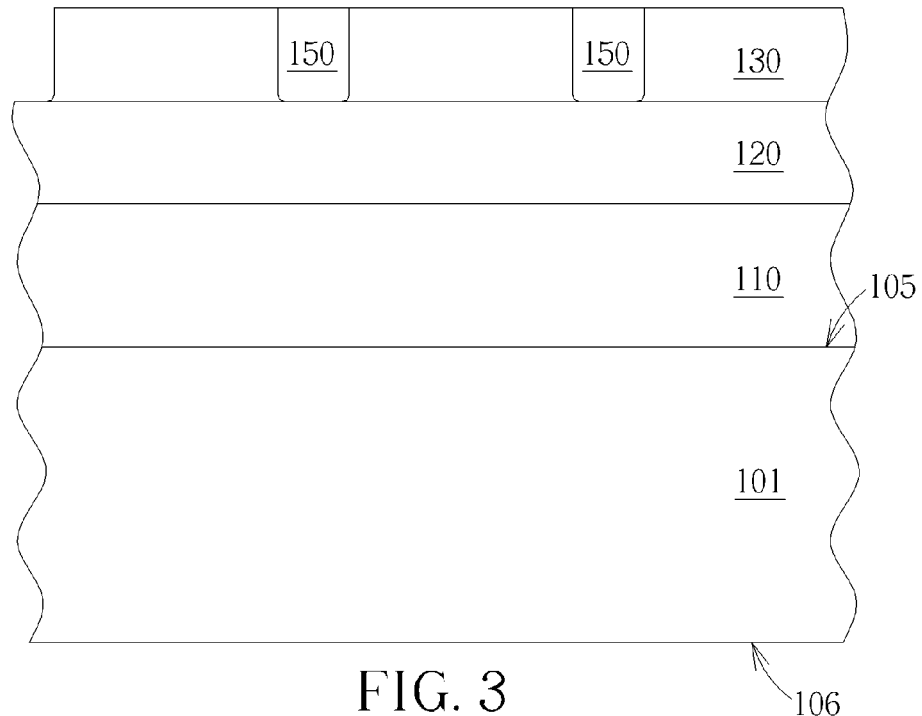
Figure 4:
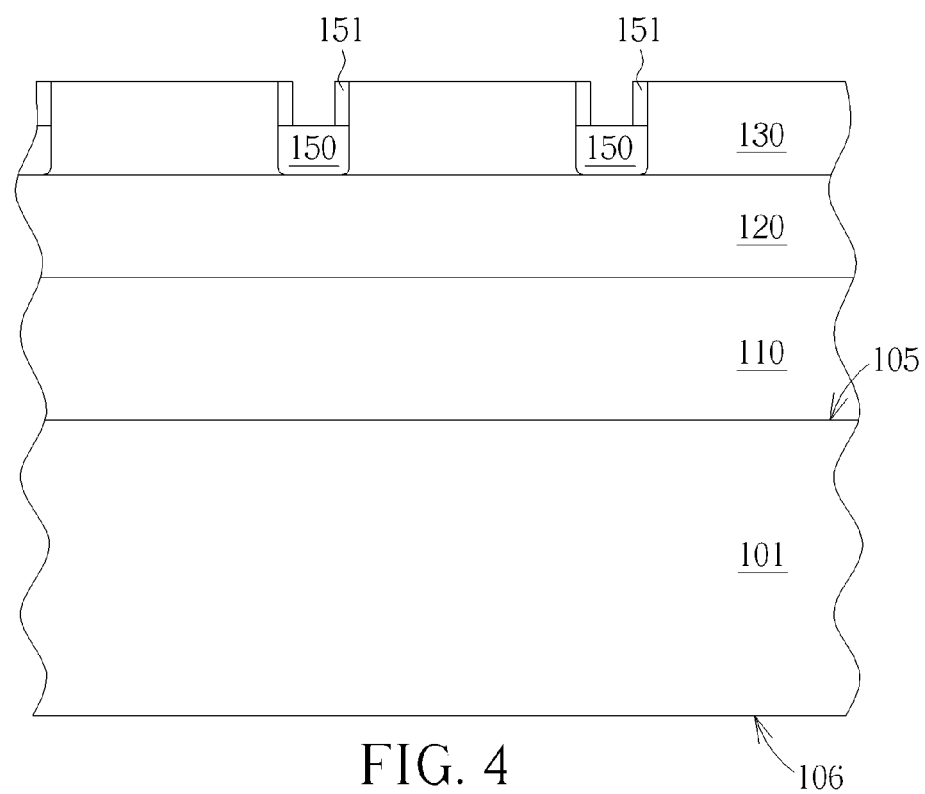

Then, a sacrificial material 150 is used to fill the preliminary via 140. The sacrificial material 150 may be a photoresist. For example, as shown in FIG. 3, the sacrificial material 150 first entirely fills the preliminary via 140. Next, the sacrificial material 150 is partially removed by an etching step, such as recess poly etch, to partially fill the preliminary via 140. When the preliminary via 140 is half full, as shown in FIG. 4, an oxidizing step, such as LP oxidation grown, may be used to form a temporary oxide layer 151 on the neck region of the preliminary via 140.

Figure 5:
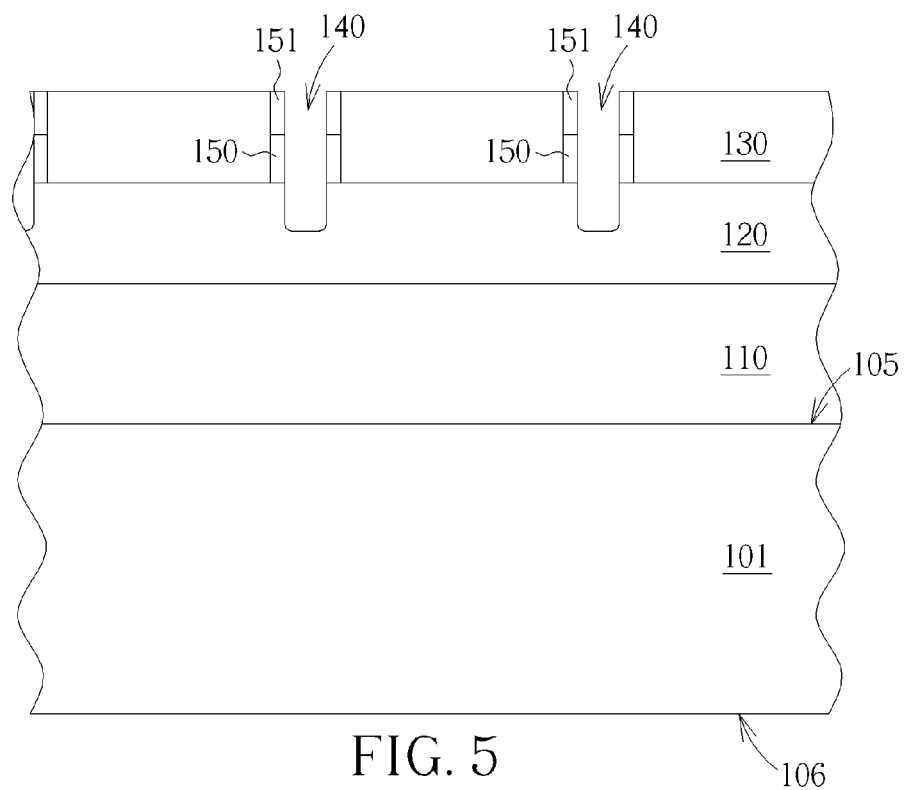
Figure 6:
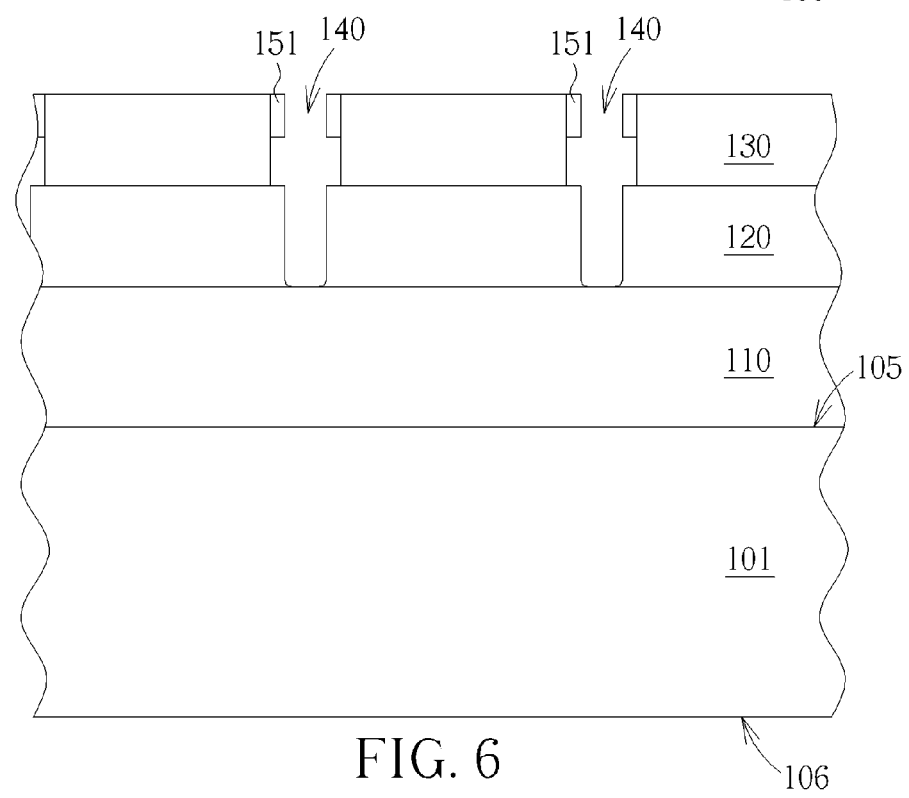

Next, as shown in FIG. 5, the temporary oxide layer 151 may be used as a mask to remove the exposed sacrificial material 150 so as to expose the underlying doping well 120. A dry etching step, such as high selectivity isotropic poly recess etch, may be used to remove the exposed sacrificial material 150 and to remove the underlying the doping well 120. Once a suitable depth of the preliminary via 140 is reached, as shown in FIG. 6, the remaining sacrificial material 150 is entirely removed by a wet etching step, such as NH$_4$OH.

Figure 7:
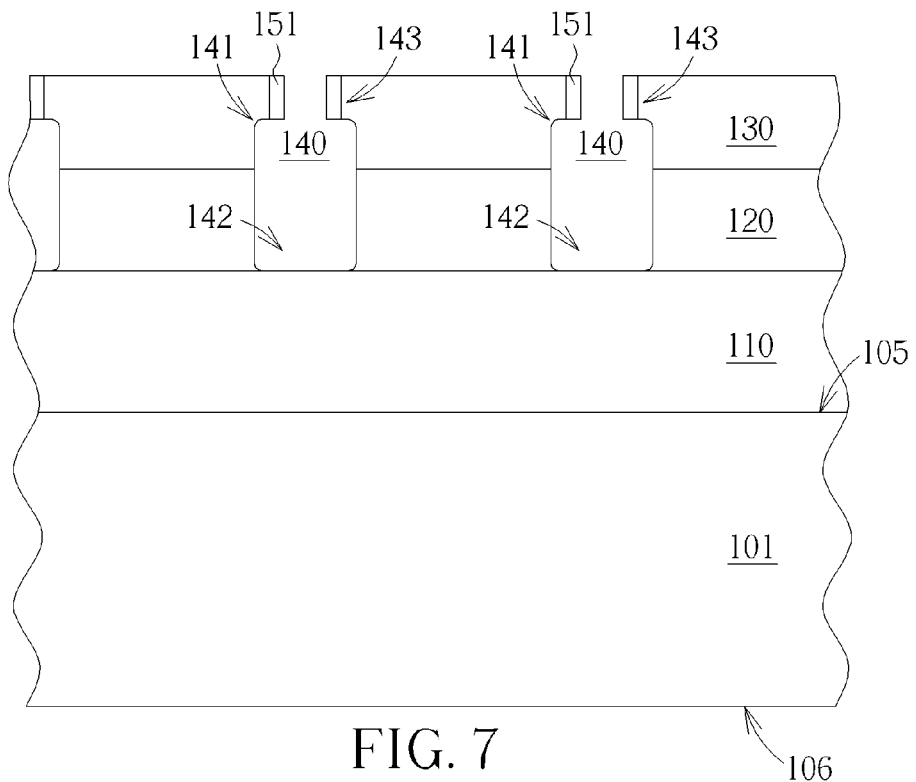
Figure 8:
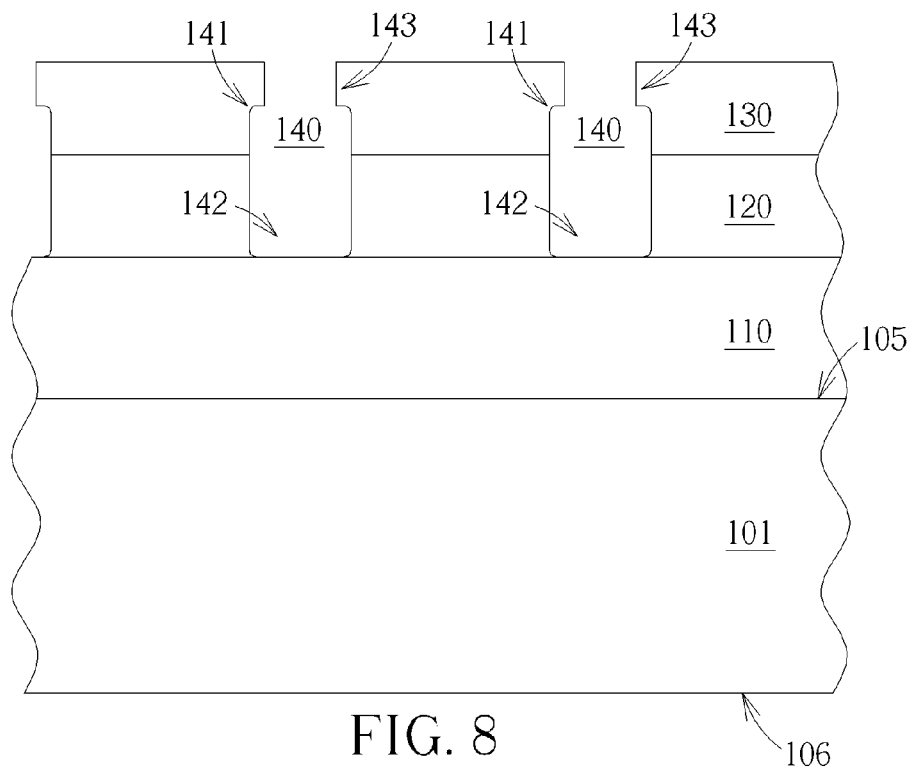

Later, as shown in FIG. 7, a lateral etching step is carried out to partially remove the doping well 120. The lateral etching step may be a wet etching step, such as higher temperature NH$_4$OH, to enlarge the lower section of preliminary via 140 for forming a bottom section 142 of a gate trench 141. At the same time, the temporary oxide layer 151 is located at the top section 143 of the gate trench 141. After the bottom section 142 of the gate trench 141 is large enough, the temporary oxide layer 151 may be removed by a wet etching step, as shown in FIG. 8.

Figure 9:
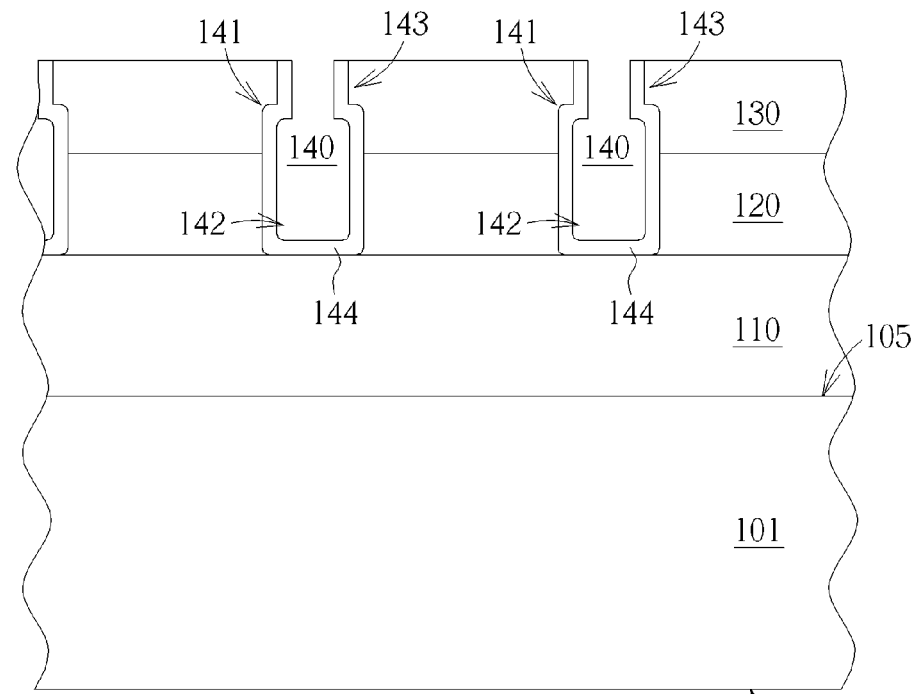
Figure 10:
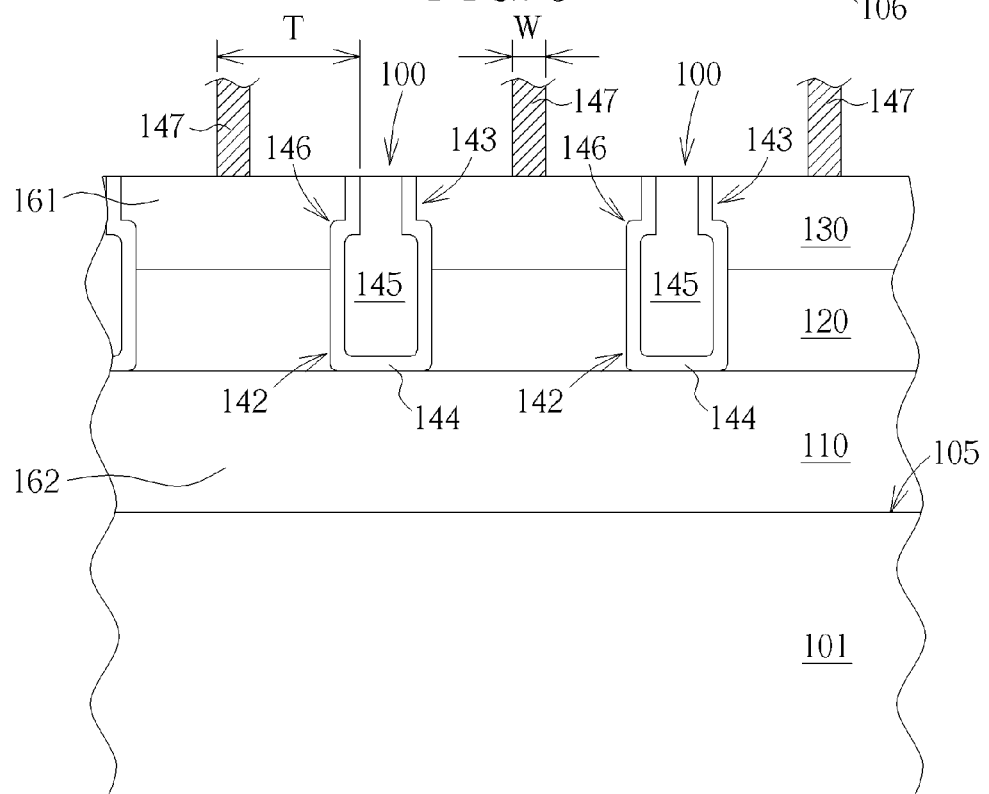
FIG. 10 illustrates a bottle-shaped trench MOS structure of the present invention.

Afterwards, as shown in FIG. 9, another oxidizing step may be carried out to form a high quality oxide layer 144, such as a gate oxide layer, disposed on the entire inner wall of the gate trench 141. Then, as shown in FIG. 10, a gate conductive material 145, such as doped Si, may be used to fill the gate trench 141 by a deposition process to obtain a bottle-shaped trench gate 146. Optionally, multiple contact plugs 147 of a plug width W may be formed for the electrical connection of the trench MOS structures 100.

Please refer to FIG. 10, after the above steps, at least one bottle-shaped trench MOS structure 100 is formed. The trench MOS structure 100 of the present invention includes a substrate 101, an epitaxial layer 110, a doping well 120, a doping region 130 and a trench gate 146. The substrate 101 is usually a semiconductive material, such as Si and of a first conductivity type, such as a P-type or an N-type, for example N type. The substrate 101 further has a first side 105 and a second side 106 opposite to and parallel with the first side 105. A source 161 may be on the doping region 130 and a drain 162 may be on the epitaxial layer 110. The epitaxial layer 110 has the first conductivity type, for example, N+ type, and is disposed on and in direct contact with the first side 105. Preferably, the epitaxial layer 110 completely covers the substrate 101.

In one aspect, the doping well 120 with a second conductivity type is disposed on and in direct contact with the epitaxial layer 110. The second conductivity type may be a P type or an N type, for example, P type. Preferably, the doping well 120 completely covers the epitaxial layer 110. In another aspect, the doping region 130 has the first conductivity type, for example, N+ type, is disposed on the doping well 120. Preferably, the doping region 130 completely covers the doping well 120.

The trench gate 146 is at least partially disposed in the doping region 130. The trench gate 146 has a bottle shape with a top section 143 and a bottom section 142. For example, the top section 143 is the bottle neck of the bottle shape. The bottom section 142 of two adjacent trench gates 146 results in a higher electrical field around the adjacent trench MOS structures 100. A gate conductive material 145, such as doped Si, fills the gate trench 141 to form the trench gate 146. One feature of the present invention resides in that the top section 143 is substantially smaller than the bottom section 142. The top section 143 and the bottom section 142 together are partially disposed in the doping region 130. When a voltage is applied on the source, the bottle-shaped trench gate 146 is able to result in a higher electrical field around the adjacent trench MOS structures 100.

There may be multiple trench gates 146 in the substrate 101. Moreover, there may also be multiple contact plugs 147 of a plug width W. Each contact plug 147 is formed for the electrical connection of the trench gates 146. The contact plugs 147 are in direct contact with the doping region 130.

In one embodiment of the present invention, there is a plug pitch T between the contact plugs 147 and the trench gates 146. In another embodiment of the present invention, the distance between any of two adjacent bottom sections 142 is not smaller than the sum of the plug pitch T and the plug width W.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a trench MOS structure, comprising:
    providing a substrate, an epitaxial layer, a doping well and a doping region, said substrate of a first conductivity type and with a first side and a second side opposite to said first side, said epitaxial layer of said first conductivity type disposed on said first side, said doping well of a second conductivity type disposed on said epitaxial layer, and said doping region of said first conductivity type disposed on said doping well;
    performing a vertical etching step to form a gate trench which penetrates said doping region and said doping well;
    providing a mask disposed in said gate trench and covering said doping well;

performing a doping region oxidizing step to form a sacrificial layer covering an inner wall of said doping region and exposing said mask;

removing said mask to expose said doping well;

performing a lateral etching step to partially remove said doping well for forming a bottom section of said gate trench;

performing an oxidizing step to form a gate isolation covering the inner wall of said bottom section and a top section of said gate trench; and filling said gate trench with a conductive material to form a trench gate.

2. The method for forming a trench MOS structure of claim 1, wherein said first conductivity type is N type.

3. The method for forming a trench MOS structure of claim 1, wherein said first conductivity type is P type.

4. The method for forming a trench MOS structure of claim 1, wherein said lateral etching step is a wet etching step.

5. The method for forming a trench MOS structure of claim 1, wherein said mask comprises a photoresist.

6. The method for forming a trench MOS structure of claim 1, further comprising:

removing said sacrificial layer after performing said lateral etching step.

7. The method for forming a trench MOS structure of claim 1, wherein said vertical etching step forms said top section which forms a bottle shape together with said bottom section.

8. The method for forming a trench MOS structure of claim 7, wherein said top section is a bottle neck of said bottle shape.

9. The method for forming a trench MOS structure of claim 1, further comprising:

forming a plurality of said trench gates adjacent to one another; and forming a plug of a plug width in direct contact with said doping region.

10. The method for forming a trench MOS structure of claim 9, wherein there is a plug pitch between said plug and said trench gate and the distance between any two adjacent bottom sections of said plurality of said trench gates is not smaller than the sum of said plug pitch and said plug width.

* * * * *